US005955821A

United States Patent [19]

Yamamoto et al.

[11] Patent Number: 5,955,821

[45] **Date of Patent: *Sep. 21, 1999**

[54] PIEZOELECTRIC ELECTRO-ACOUSTIC TRANSDUCER

[75] Inventors: Kazuaki Yamamoto, Takaoka; Hiroyuki Inami, Toyama-ken; Shuho Saito, Toyama, all of Japan

[73] Assignee: Murata Manufacturing Co., Ltd., Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/899,932

[22] Filed: Jul. 24, 1997

[30] Foreign Application Priority Data

Jul. 29, 1996 [JP] Japan .................................... 8-199244

[51] Int. Cl.[6] .................................................... H01L 41/08

[52] U.S. Cl. ........................... 310/324; 310/321; 310/326

[58] Field of Search .................................... 310/324, 326, 310/321

[56] References Cited

U.S. PATENT DOCUMENTS

| | | | |
|---|---|---|---|
| 3,700,938 | 10/1972 | Bryant | 310/324 |
| 4,190,782 | 2/1980 | Guess | 310/324 |
| 4,273,399 | 6/1981 | Myess et al. | 310/324 X |
| 4,630,465 | 12/1986 | Hatton | 310/324 X |
| 4,641,054 | 2/1987 | Takahata et al. | 310/324 |
| 4,965,483 | 10/1990 | Abe et al. | 310/324 |
| 5,053,671 | 10/1991 | Kobayashi et al. | 310/324 X |
| 5,226,325 | 7/1993 | Komurasaki et al. | 310/324 X |
| 5,371,428 | 12/1994 | Kikuchi et al. | 310/324 |

FOREIGN PATENT DOCUMENTS

| | | | |
|---|---|---|---|
| 52-24399 | 6/1977 | Japan . | |
| 0234899 | 9/1989 | Japan | 310/324 |
| 5-90594 | 12/1993 | Japan . | |

*Primary Examiner*—Mark O. Budd
*Attorney, Agent, or Firm*—Joseph R. Keating, Esq.; Graham & James LLP

[57] ABSTRACT

A piezoelectric electro-acoustic transducer has a substantially decreased resonant frequency without having to modify the size of a piezoelectric diaphragm or the shape of casing members used therein. The piezoelectric electro-acoustic transducer has a piezoelectric diaphragm including a metal plate and a piezoelectric ceramic disc disposed on one surface of the metal plate, wherein the piezoelectric diaphragm is to be supported at its periphery. A plurality of projections are specifically provided for stress transmission suppression at the periphery of the piezoelectric diaphragm in order to suppress or eliminate occurrence of circumferential transmission of a stress at the periphery during activation of the transducer.

10 Claims, 8 Drawing Sheets

PIEZOELECTRIC ELECTRO-ACOUSTIC TRANSDUCER

BACKGROUND OF THE INVENTION

1. Field of the Invention

The present invention relates generally to piezoelectric electro-acoustic transducers adaptable for use as piezoelectric buzzers and the like, and more particularly, to piezoelectric electro-acoustic transducers including a piezoelectric diaphragm having an improved structure for lowering the resonant frequency of the transducer.

2. Description of the Prior Art

A conventional piezoelectric electro-acoustic transducer is disclosed in, for example, Published Unexamined Japanese Patent Application No. 52-24399. This prior art device includes a piezoelectric diaphragm which is supported by a first cylindrical casing having a relatively greater diameter and a second cylindrical casing having relatively smaller diameter. More specifically, in the prior art device, an "intermediate" step-like section extends circumferentially along the inner wall surface of the first cylindrical casing at a position corresponding to a vertical midpoint thereof, causing the piezoelectric diaphragm to be sandwiched at its peripheral portion between the intermediate step-like section and the terminal edge of the first and second cylindrical casings thereby to provide a rigid support for the piezoelectric diaphragm.

Unfortunately, such a piezoelectric electro-acoustic transducer of the type disclosed in Unexamined Japanese Patent Application No. 52-24399 experiences a problem. Because the piezoelectric diaphragm is supported along its entire circumference at the peripheral edge thereof, if an acoustic or sound pressure, e.g., the resonance frequency, must be shifted or offset into an even lower range, the piezoelectric diaphragm might be increased in diameter or alternatively decreased in thickness.

Obviously, where the piezoelectric diaphragm is enlarged in diameter, the resultant piezoelectric electro-acoustic transducer has a correspondingly increased size. When the piezoelectric diaphragm is made to be thinner, it is required that the piezoelectric ceramic plate constituting the piezoelectric diaphragm and/or a metal plate onto which the piezoelectric ceramic plate is adhered be reduced in thickness, which in turn causes difficulty of manufacture, an increase in cost and/or a decrease in stability of characteristics.

Another prior art piezoelectric electro-acoustic transducer is disclosed in, for example, Published Unexamined Japanese Utility-Model Publication No. 5-90594, which transducer is capable of attaining a peak sound pressure in a much lower frequency range without having to modify the diameter and/or thickness of the piezoelectric diaphragm.

With the piezoelectric electro-acoustic transducer disclosed in Unexamined Japanese Utility-Model Publication No. 5-90594, a disk-shaped piezoelectric diaphragm is supported by a first cylindrical casing and a second cylindrical casing inserted into the first casing. More specifically, the disk-like piezoelectric diaphragm is supported by a combination of an intermediate step-like section circumferentially extending on the inner wall of first cylindrical casing and the opening edge surface of second cylindrical casing.

In order to force the acoustic peak point to shift toward the low-frequency side, this prior art device is provided with cut-away portions formed at selected locations in the first and second cylindrical casings at which the piezoelectric diaphragm is supported. Such cutaway portions permit partial support of the piezoelectric diaphragm only at a part of the circumferential edge along the periphery of piezoelectric diaphragm.

According to the description in Unexamined Japanese Utility-Model Publication No. 5-90594, it has been explained that the low-frequency shift of an acoustic pressure peak can be accomplished by partially supporting the piezoelectric diaphragm at the periphery thereof.

A problem with such devices as shown and described in Unexamined Japanese Utility-Model Publication No. 5-90594 is that the arrangement of the piezoelectric diaphragm relative to the first and second cylindrical casings causes stress to be transmitted from the piezoelectric diaphragm to the first and second cylindrical casings. The formation of the cut-away portions in the first and second cylindrical casings, while lowering the acoustic pressure peak, do not suppress or prevent the transmission of stress from the piezoelectric diaphragm to the first and second cylindrical casings.

Another serious problem encountered with the prior art devices is that they suffer from the existence of limits for such low-frequency of the acoustic pressure even with use of such a partial support structure resulting from an improvement in the casing structure for mechanical support of the disk-like piezoelectric diaphragm by the first and second cylindrical casings. In other words, the resonance frequency can never be simply lowered in value and there might be a limit for any further decrease in resonance frequency beyond a certain value. This makes it impossible or at least extremely difficult to use this prior art structure for some applications which strictly require achievement of extra low resonance frequency.

Another disadvantage of the prior art structure disclosed in Unexamined Japanese Utility-Model Publication No. 5-90594 is that the use of specific casing members of a specially designed shape is required for achievement of such partial support of the piezoelectric diaphragm. This results in an unwanted increase in manufacturing cost because a variety of type of unique and specially designed casing members must be prepared in accordance with a target value of the resonance frequency in a case-by-case manner.

SUMMARY OF THE INVENTION

To overcome the problems discussed above, the preferred embodiments of the present invention provide a piezoelectric electro-acoustic transducer achieving an extra-low resonant frequency without requiring any modification in a diameter and a thickness of the piezoelectric diaphragm and also without the necessity of using any special casing members therefor.

In accordance with preferred embodiments of the present invention, there is provided a piezoelectric electro-acoustic transducer having a piezoelectric diaphragm including a metal plate and a piezoelectric element disposed on one surface thereof, the transducer being supported at a periphery of the piezoelectric diaphragm, wherein the transducer includes a stress transmission suppression device provided at the periphery of the piezoelectric diaphragm, for suppressing circumferential transmission of stress at the periphery during electrical activation or energization.

More specifically, the preferred embodiments of the present invention suppress or eliminate circumferential transmission of stress at the periphery of the piezoelectric diaphragm for achieving a decrease in the resonance frequency of piezoelectric electro-acoustic transducers of the type which have a piezoelectric diaphragm including a metal plate and a piezoelectric ceramic disc disposed on one surface thereof, which diaphragm is supported at the periphery thereof. In the preferred embodiments of the present invention, the piezoelectric diaphragm includes a specific stress transmission suppression device for achieving reliable suppression of circumferential transmission of stresses at the periphery of the piezoelectric diaphragm. By preventing the transmission of stress at the periphery of the piezoelectric diaphragm before the stress has an opportunity to travel to the first or second casings, the resonant frequency of piezoelectric electro-acoustic transducers is lowered substantially.

In accordance with another preferred embodiment of the present invention, the stress transmission suppression device is preferably configured by providing the piezoelectric diaphragm with at least one unsupported portion at the periphery thereof.

The stress transmission suppression device may actually have various types of configurations, which include, but are not limited to, a plurality of laterally projecting portions located at the periphery of the piezoelectric diaphragm with a space being defined between the plurality of projecting portions. Alternatively, the stress transmission suppression device may comprise slits extending from the periphery of the piezoelectric diaphragm toward the an interior thereof. Still alternatively, the stress transmission suppression device may include one or more window sections provided near the piezoelectric diaphragm.

In accordance with still another preferred embodiment of the invention, the piezoelectric electro-acoustic transducer further includes first and second casing members each having a closed-loop support plane, wherein the piezoelectric diaphragm is disposed between the closed-loop support planes of the first and second casing members thereby causing the periphery of the piezoelectric diaphragm to be partially supported by the stress transmission suppression device.

In accordance with a yet another preferred embodiment of the invention, the first casing member is a first tubular or cylindrical casing that has a step-like section on the inner circumferential surface thereof for providing the closed-loop support plane whereas the second casing member is a second cylindrical casing inserted into the first casing member and also has one end surface constituting the closed-loop support plane.

It should be noted that the first and second cylindrical casing members do not always have to be of the cylindrical shape; alternatively, they may have other shapes, including rectangular, triangular, parellpiped and other geometric tubular shapes selected depending upon the planar shape of the piezoelectric diaphragm.

It should also be noted that the piezoelectric diaphragm may alternatively have different shapes other than the disk-like shape. Accordingly, the word "periphery" used herein for the piezoelectric diaphragm should not exclusively be intended to mean the circumferential periphery of such a disk-like diaphragm; it may also refer to any possible peripheral edges such as rectangular or square or other shaped diaphragms.

It should further be noted that the term "closed-loop shape" used herein for the support planes of the first and second casing members should not exclusively be interpreted as the circular loop; it may alternatively be rectangular loops or other shapes in certain situations.

Additionally, the closed-loop shaped support planes should not exclusively be limited to those having a certain width along the closed loop, and it should be appreciated by those skilled in the art that the planes may also include an arrangement where the piezoelectric diaphragm is structured using closed-loop support planes with substantially no widths for achieving a linear contact therewith.

These and other elements, features, and advantages of the preferred embodiments of the present invention will be apparent from the following detailed description of the preferred embodiments of the present invention, as illustrated in the accompanying drawings.

DETAILED DESCRIPTION OF PREFERRED EMBODIMENTS

Figure 1:
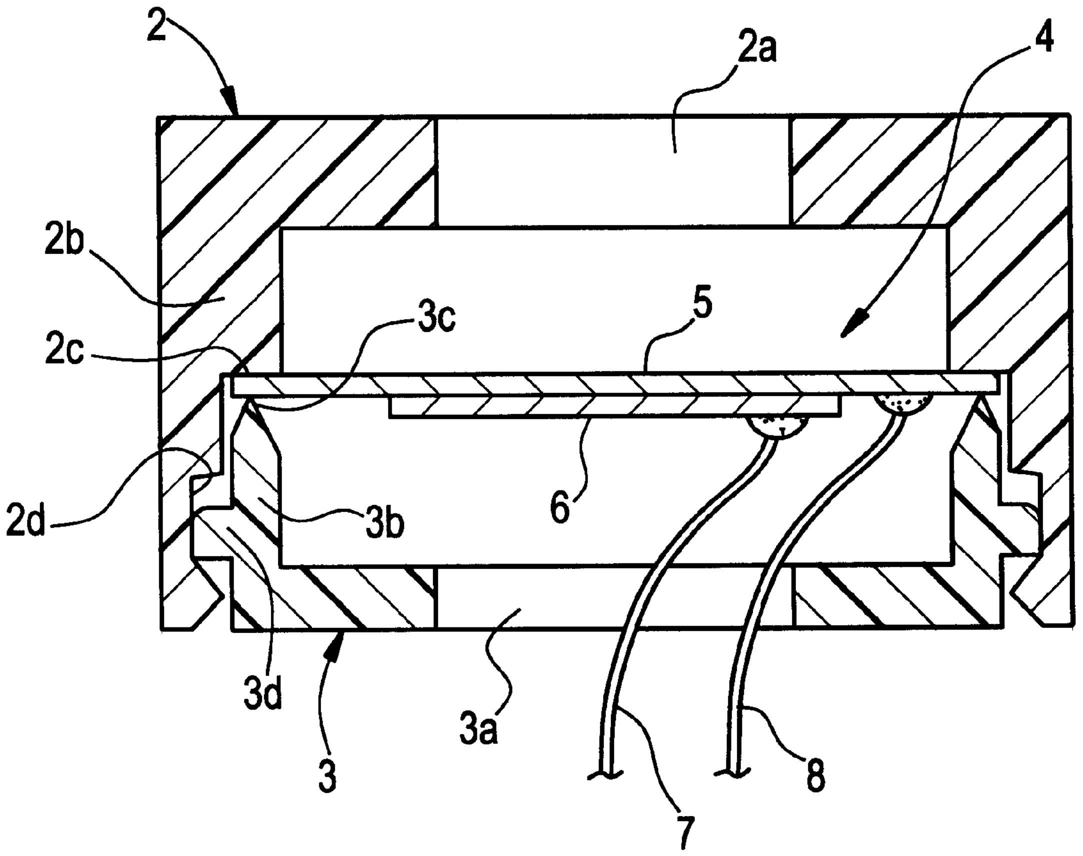
FIG. 1 is a diagram showing a cross-section of a piezoelectric electro-acoustic transducer in accordance with a first preferred embodiment of the present invention.

FIG. 1 is a diagram showing one longitudinal cross-section of a piezoelectric electro-acoustic transducer in accordance with a first preferred embodiment of the present invention.

The piezoelectric electro-acoustic transducer 1 includes a first tubular or cylindrical casing member 2 having a relatively large diameter and a bottom at one end thereof, and a second cylindrical casing member 3 having a relatively small diameter and a bottom. The first and second cylindrical casings 2 and 3 may be made of a suitable material including, but not limited to, synthetic resin, metal, ceramics, or the like.

The cylindrical casing 2 has an opening 2*a* for radiation of acoustic waves, which opening is substantially centrally located in an upper plane thereof. The casing 2 also has a substantially cylindrical section 2*b* extending downwardly from the periphery of the upper plane. A step-like section is provided at an approximate vertical center portion of the inner wall of cylinder 2*b* in such a manner that the lower surface of such step constitutes a circular closed-loop support plane 2*c* which defines a ring-like support plane. A circumferentially elongated engagement recess portion 2*d* is provided at the inner wall of casing 2 at a location lower than the ring-like support plane 2*c*.

On the other hand, the cylindrical casing 3 has an opening 3*a* which is substantially centrally defined in the bottom plate thereof. This opening 3*a* is for use in allowing lead wires 7, 8 to extend therethrough to the outside. The lead wires 7, 8 serve as electrode potential coupling devices as will be described in detail later.

A substantially cylindrical section 3*b* extends upwardly from the peripheral edge section of the bottom plate of the cylindrical casing 3. The upper edge of the upstanding cylinder section 3*b* constitutes a circular closed-loop support plane 3*c* defining a ring-like support plane. Also, at the vertical center portion of cylinder 3*b*, an engagement projection 3*d* is disposed so as to project outwardly. This projection 3*d* is provided for rigid engagement with the recess 21*d* disposed at the first cylindrical casing 2.

A piezoelectric diaphragm 4 preferably includes a lamination member having a metal plate 5 preferably made of brass, 42Ni—Fe alloy, stainless steel, or the like, and a piezoelectric ceramic disc 6 disposed on the lower surface of metal plate 5. The piezoelectric ceramic disc 6 has a lower surface on which an electrode (not shown) is formed. The lead 7 is electrically coupled to the lower-surface electrode of piezoelectric ceramic disc 6 whereas the lead 8 is connected to the lower surface of metal plate 5. These leads 7, 8 constitute an electrode potential coupling device for application of a drive voltage via leads 7, 8 thereby to electrically excite or energize the piezoelectric ceramic disc 6 so that the ceramic disc 6 vibrates together with metal plate 5.

Incidentally, the piezoelectric diaphragm 4 is physically supported in such a way that it is fixed between the ring-like support plane 2*c* of the first cylindrical casing 2 and the ring-like support plane 3*c* of second cylindrical casing 3.

Figure 2:
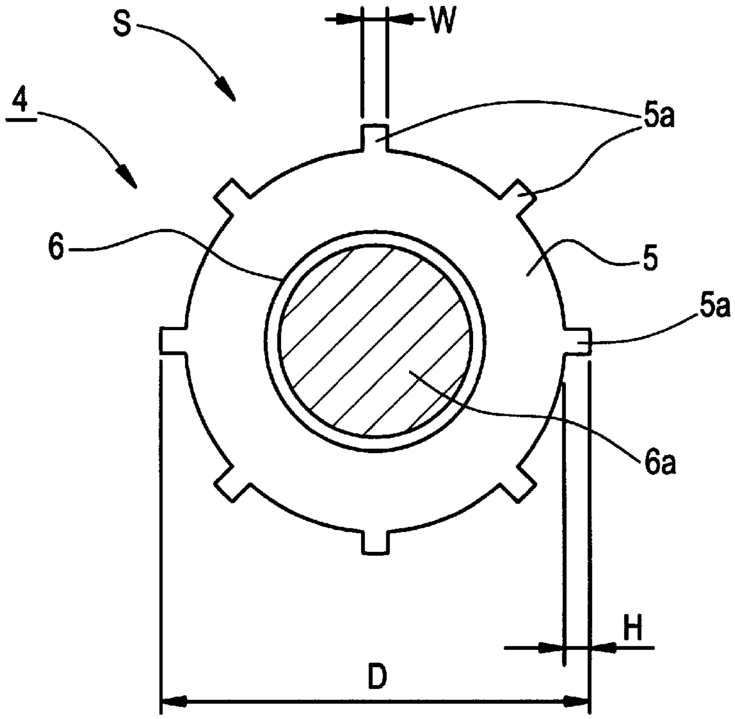
FIG. 2 is a diagram showing a bottom view of a piezoelectric diaphragm included in the piezoelectric electro-acoustic transducer of the first preferred embodiment.

One principal feature of this preferred embodiment is that the piezoelectric diaphragm 4 includes a stress transmission suppression device as shown in a bottom view of FIG. 2.

As can be seen from FIG. 2, the metal plate 5 of piezoelectric diaphragm 4 has an outer peripheral edge on which a plurality of projections 5*a* are provided. As a result of this circumferential distribution of plural spaced-apart projections 5*a* at the outer periphery of metal plate 5, a vacant or air space is to be defined between adjacent projections 5*a*.

In the illustrative preferred embodiment, the piezoelectric diaphragm 4 is sandwiched between the ring-like support planes 2*c*, 3*c* shown in FIG. 1 at specific portions where the plural projections 5*a* are provided.

Accordingly, the piezoelectric diaphragm 4 is partially supported at selected points along its outer periphery; therefore, the resonant frequency can be lowered in value in a manner similar to that in the case of a piezoelectric electro-acoustic transducer as disclosed in Unexamined Japanese Utility-Model Publication No. 5-90594.

In addition to such reduction in resonance frequency, since in the illustrative preferred embodiment a plurality of projections 5*a* define a plurality of spaces S forming; a stress transmission suppression device at the piezoelectric diaphragm between adjacent ones of the multiple projections 5*a*, even where stress occurs at the piezoelectric diaphragm 4 during driving, which stress is transferred in the circumferential direction, the spaces S defined by arrangement of projections 5*a* interrupt and prevent such transmission of stress between projections 5*a*. This enables suppression or elimination of circumferential transmission of any stress at the piezoelectric diaphragm itself, enabling achievement of a further reduction of the resonance frequency. Accordingly, it is possible to provide an improved piezoelectric electro-acoustic transducer achieving a further lowered resonance frequency as compared with the prior known piezoelectric electro-acoustic transducer as disclosed in Unexamined Japanese Utility-Model Publication No. 5-90594.

It should be noted in FIG. 2 that reference character "6*a*" designates one electrode which is arranged so as to define a certain gap at the periphery on the lower surface of the piezoelectric ceramic disc 6.

The possibility of successfully decreasing the resonance frequency with this preferred embodiment will be more fully explained in connection with some practical experimental results.

An experimental sample of the piezoelectric diaphragm shown in FIG. 2 was prepared and had the following measurements: about 0.5 mm height H of each of the plurality of projections 5*a*; about 15 mm diameter D (i.e., the diameter of metal plate 5 including the upper edges of projections 5*a*); 0.1 mm thickness of the metal plate 5; about 9 mm diameter of piezoelectric ceramics disc 6; and, about 0.08 mm thickness of piezoelectric ceramic disc 6. Note here that the number of plural projections 5*a* was set at eight (8) along the circumferential direction as shown in FIG. 2.

Figure 8:
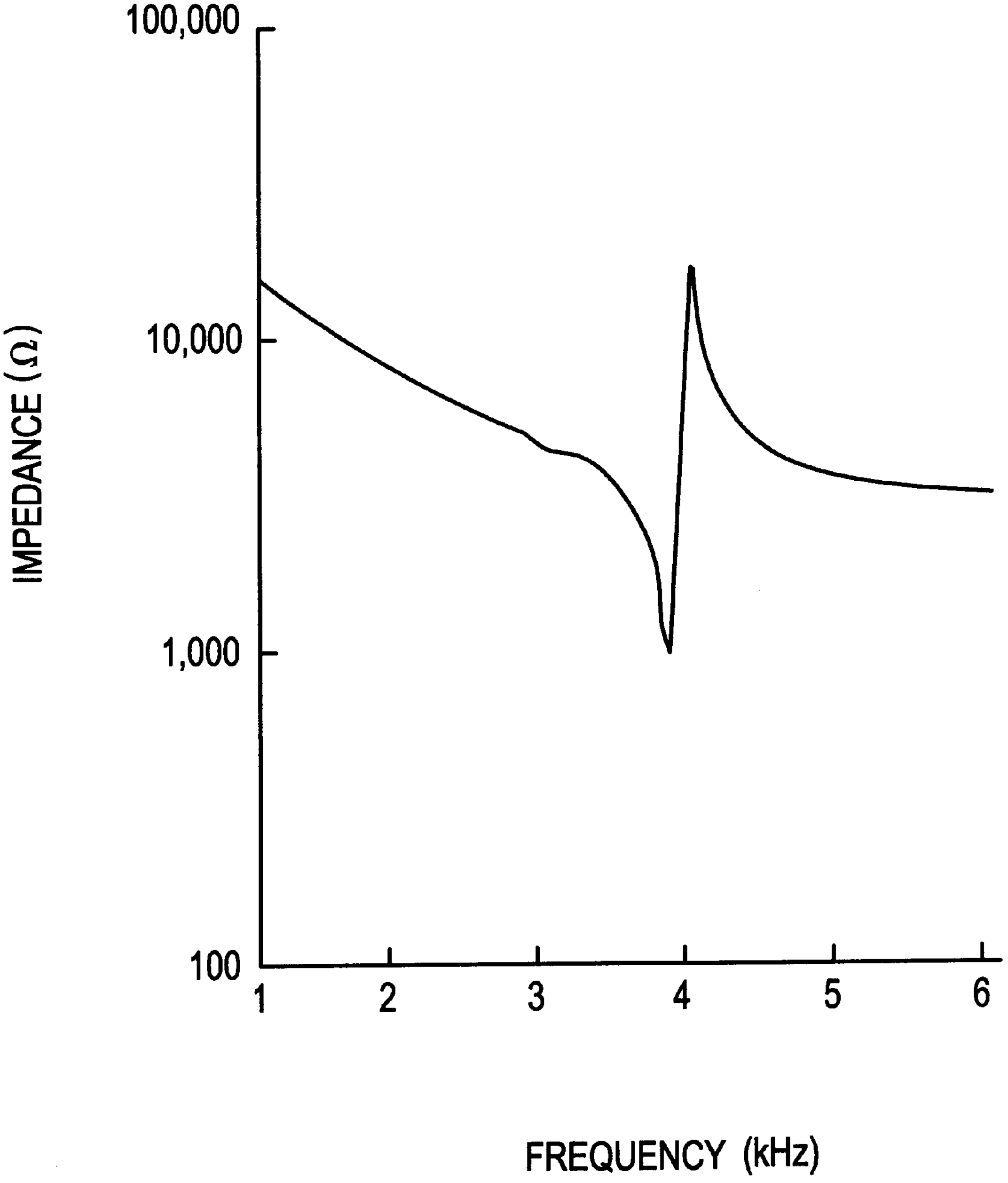
FIG. 8 is a graph demonstrating resonance frequency characteristics of the piezoelectric electro-acoustic transducer of the first preferred embodiment.

The piezoelectric diaphragm 4 was sandwiched between the first cylindrical casings 2, 3 shown in FIG. 1, and was then subject to measurement of the resonant frequency thereof obtaining an experimental result presented in the graph of FIG. 8, which demonstrates that resultant resonance frequency was as low as 3.76 kHz.

Figure 9:
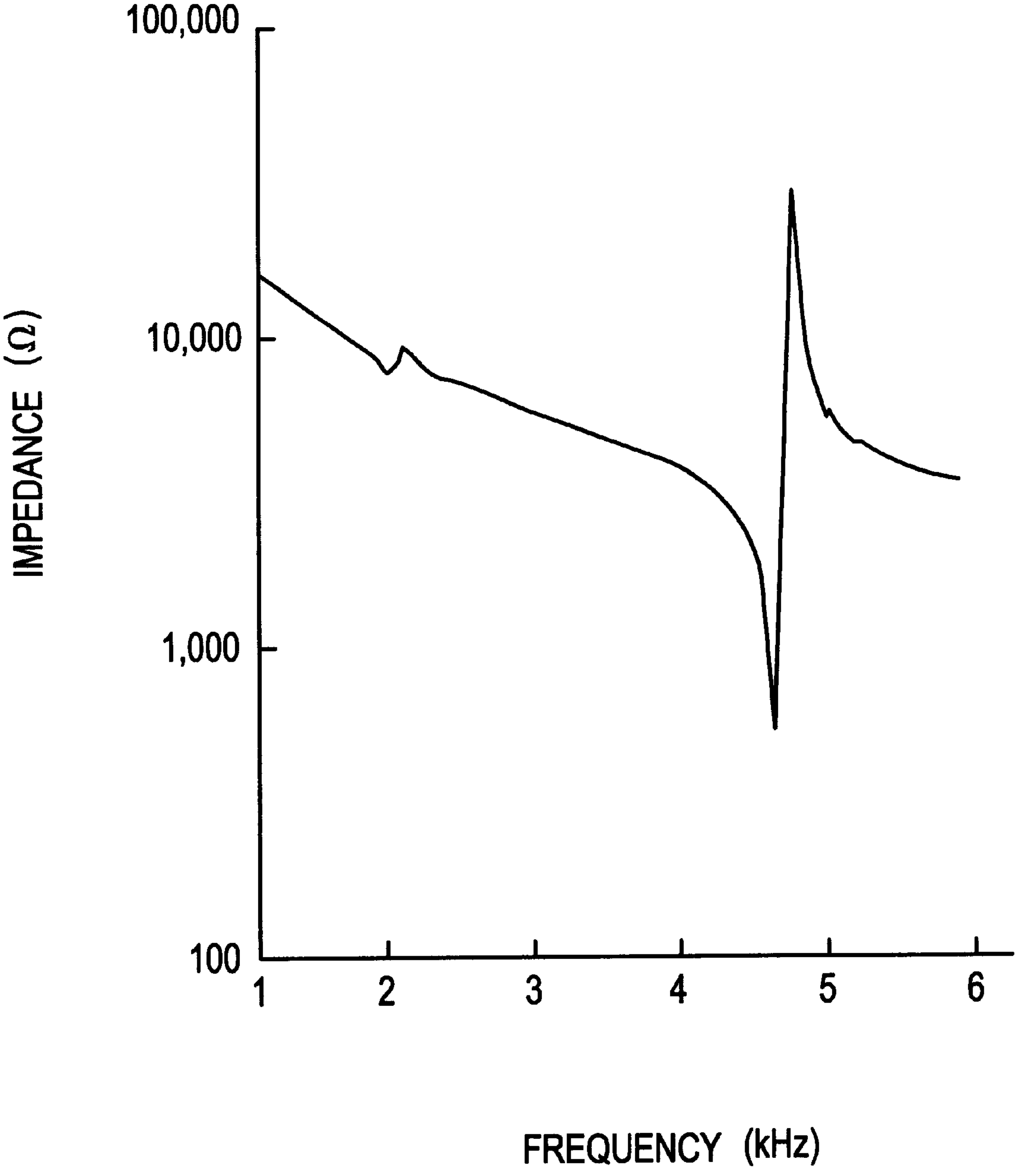
FIG. 9 is a graph presenting resonance frequency characteristics of a prior art piezoelectric electro-acoustic transducer sample for comparison with the preferred embodiment.

On the contrary, another sample for comparison was prepared which was similar to the one described above with the plural projections 5*a* being excluded and with the metal plate being replaced by a metal plate of a 15-mm thickness. This sample was subject to measurement of the resonance frequency obtaining a result shown in FIG. 9, which reveals the fact that the center frequency was as high as 4.69 kHz.

Consequently, it can be seen by those skilled in the art that the illustrative preferred embodiment decreases the resonance frequency by at least 20%.

Note that as to the size of the plural projections 5*a*, i.e., the width W and height H of projections 5*a* as well as the number thereof, this preferred embodiment should not exclusively be limited to the exemplary value settings presented previously. In this regard, it has been verified that appropriate adjustments of the width W, height H and number may enable more successful reduction of resonant frequency.

Figure 10:
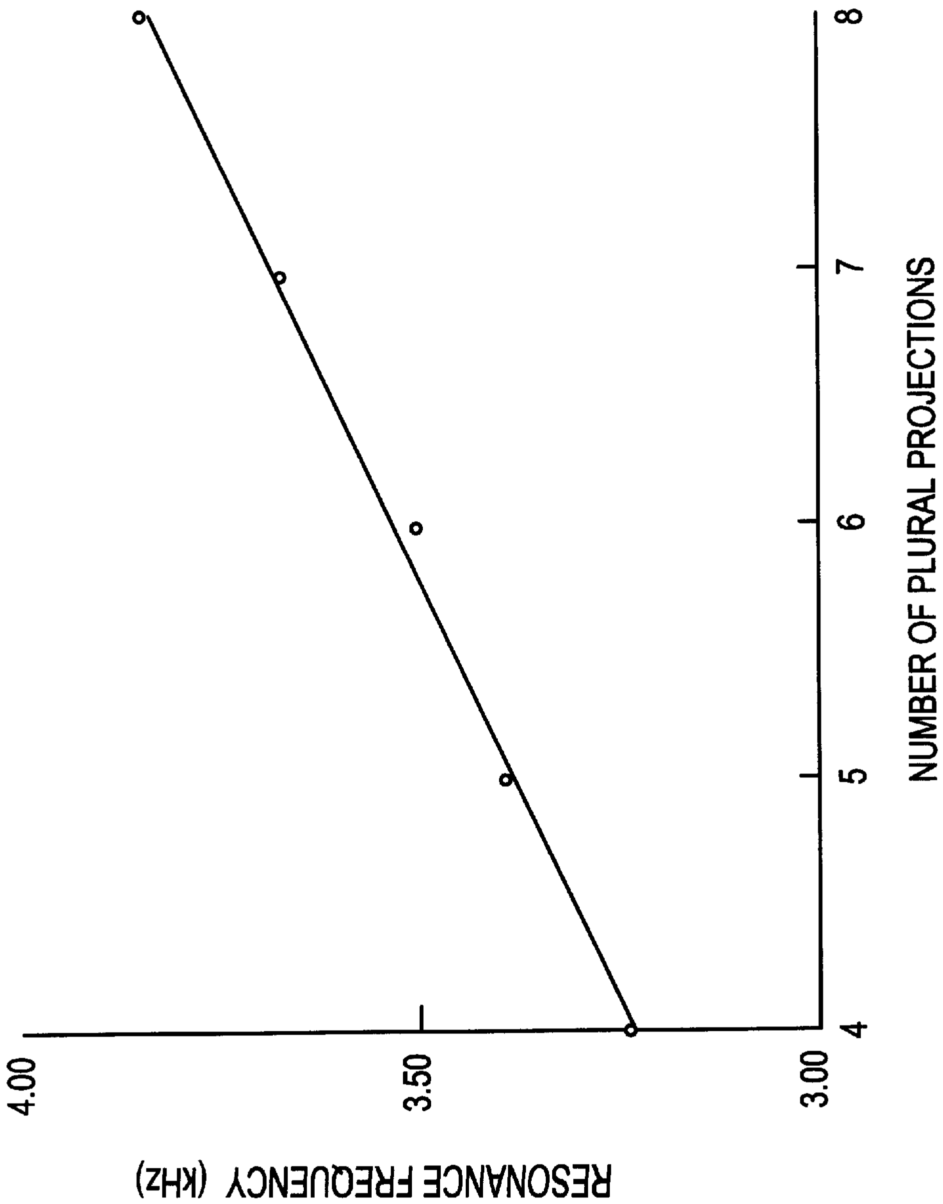
FIG. 10 is a graph showing a relationship of the number of plural projections versus resonance frequency.

More specifically, in the piezoelectric electro-acoustic transducer with the resonance frequency characteristics shown in FIG. 8, similar resonance-frequency measurement was done with the projections 5*a* provided at the piezoelectric diaphragm being changed in number, obtaining a result shown in FIG. 10. As can be seen from the graph of FIG. 10, the resonance frequency can be further decreased or lowered by causing the number of projections to decrease from eight (8) down at four (4). Note however that it is preferred that the projection number n be two (2) or greater. If the projection number n were less than 2 then it becomes very difficult to mechanically support the piezoelectric diaphragm, which in turn renders it difficult to offer intended advantages.

Regarding the width W and height H as well as the diameter D of the metal plate 5 shown in FIG. 2, it may be preferable to design these elements so as to satisfy:

$$(1/24)\pi D \leqq W1+W2+W3\ldots+Wn \leqq (1/2)\pi D, \quad (1)$$

$$(1/10)W \leqq H \leqq 2W. \quad (2)$$

Additionally, where a plurality of projections 5*a* are provided, the intervals between the projections 5*a* 1may preferably be equal or uniform; however, it has been found that the intervals may alternatively be inconsistent or variable among projections 5*a* when necessary.

Figure 3:
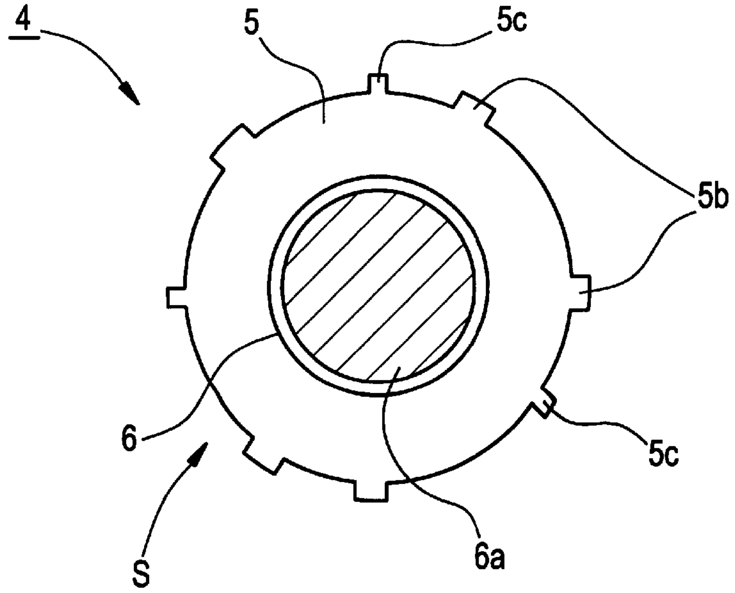
FIG. 3 is a diagram illustrating a piezoelectric diaphragm with a plurality of projections of different shapes disposed at its peripheral edge.

Furthermore, as shown in the bottom view of FIG. 3, when forming plural projections 5*a*, these may be configured so that certain projections 5*b*, 5*c* of different sizes are provided.

Figure 4:
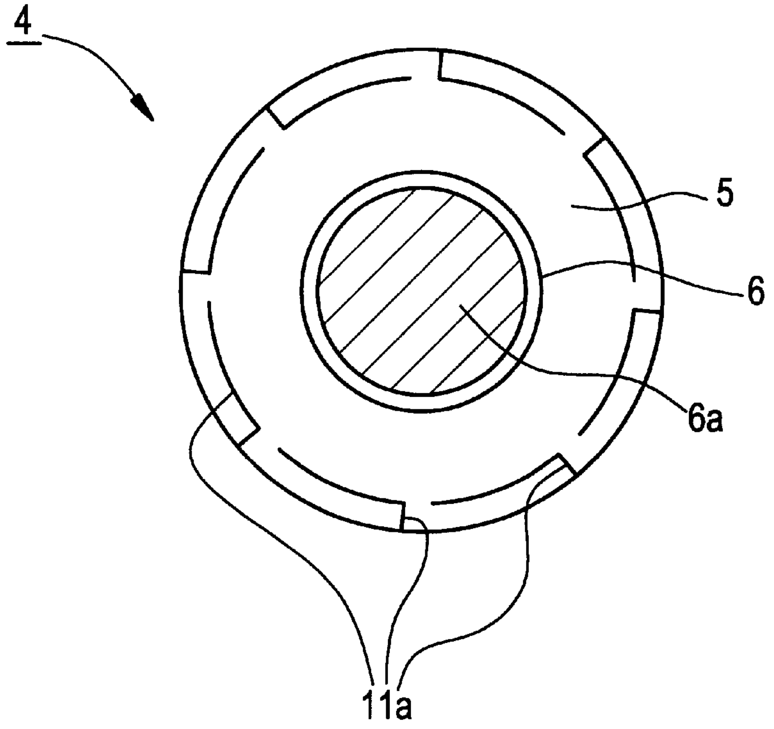
FIG. 4 is a diagram depicting a bottom view of a piezoelectric diaphragm with a stress transmission suppression device including a plurality of slits provided in the diaphragm.
Figure 5:
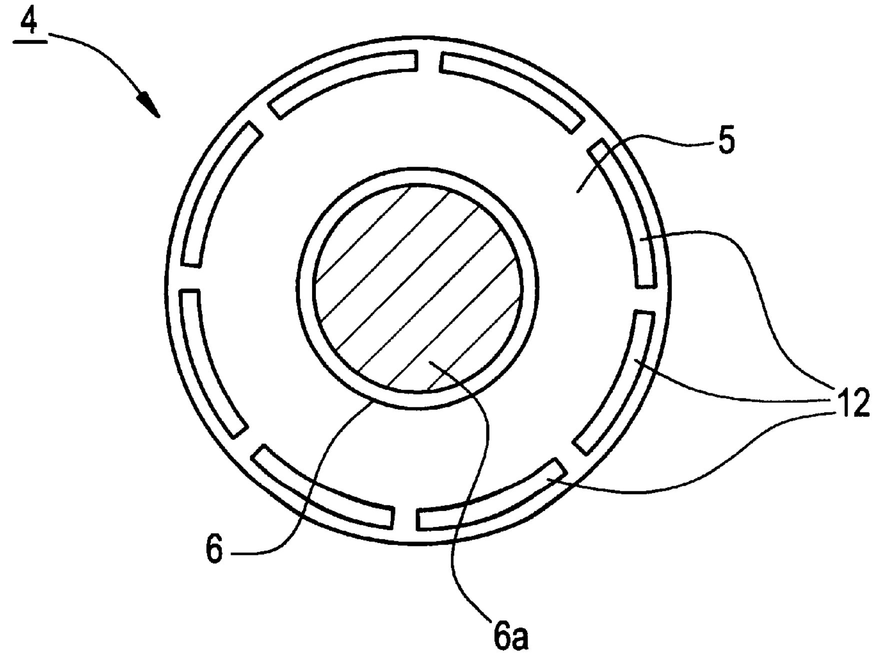
FIG. 5 is a diagram showing a bottom view of a piezoelectric diaphragm with a stress transmission suppression device including a plurality of windows formed in the diaphragm.

Moreover, in the above preferred embodiment, while the stress transmission suppression device S as provided at the piezoelectric diaphragm 4 is defined by a plurality of projections 5*a*, forming the spaces S this may be modified in such a way that a plurality of slits 11*a* each extending from the outer circumferential periphery of the metal plate 5 toward the center thereof as shown in a bottom view of FIG. 4, thereby constituting the stress transmission suppression device. Similarly, as shown in FIG. 5, multiple window sections 12 are provided near the outer circumferential edge of the metal plate for defining the stress transmission suppression device.

Figure 12:
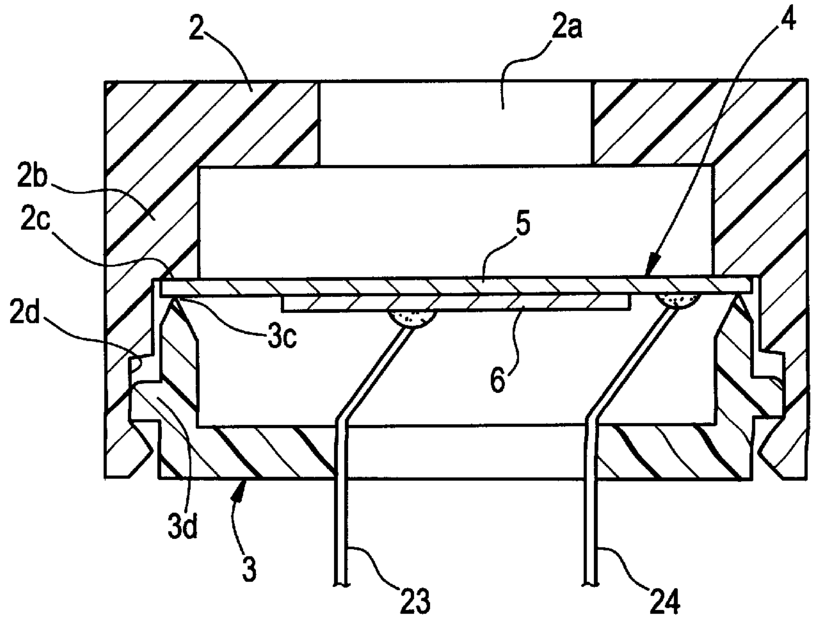
FIG. 12 illustrates in cross-section one modification of the piezoelectric electro-acoustic transducer in accordance with the first preferred embodiment of the invention.

In other words, the stress transmission suppression device of the preferred embodiments of the present invention should not be exclusively limited to any one of the illustrative preferred embodiments insofar as it can offer capability of interrupting or suppressing transmission of stress in the circumferential direction of the metal plate during activation of the piezoelectric electro-acoustic transducer; the suppression device may freely be modified to employ the slits 11*a* shown in FIG. 4, or the windows 12 shown in FIG. 12 when appropriate.

Figure 6:
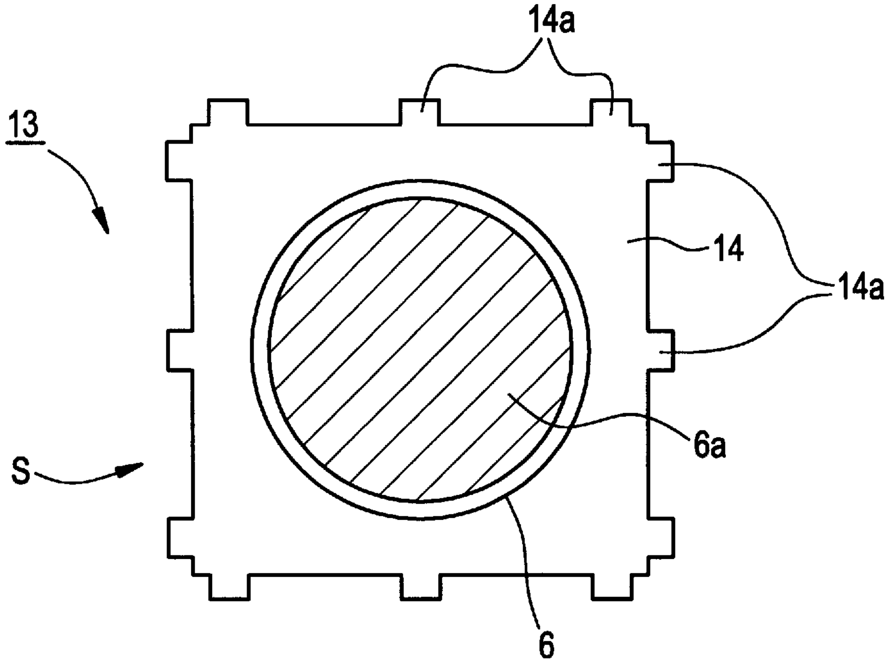
FIG. 6 is a diagram showing a bottom view of a substantially square piezoelectric diaphragm having multiple substantially equal-sized projections provided at the outer periphery thereof.
Figure 7:
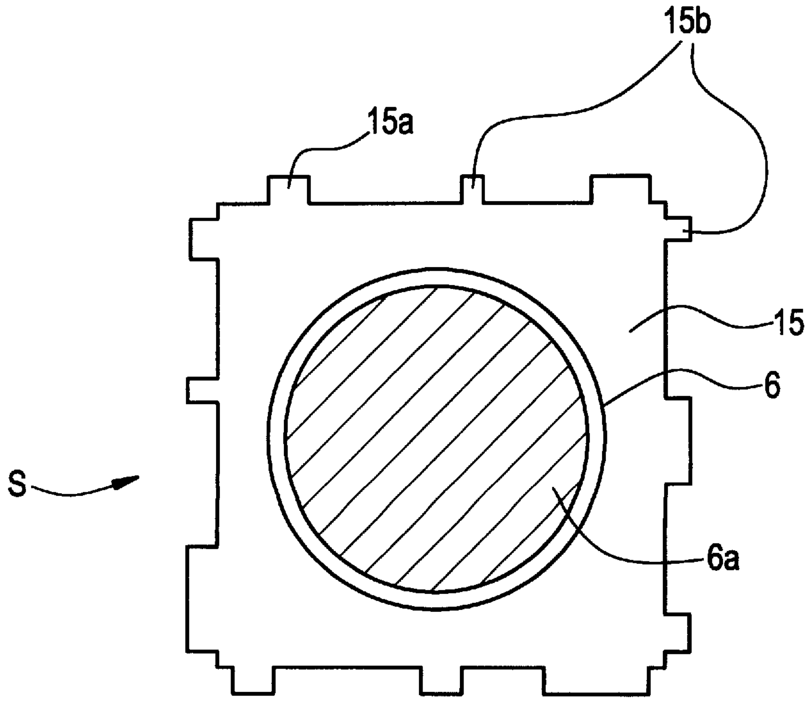
FIG. 7 is a diagram showing a bottom view of a square piezoelectric diaphragm with a plurality of projections having different sizes and being provided at the outer periphery thereof.

In addition, while the preferred embodiments described above are designed to make use of the piezoelectric diaphragm 4 which preferably has a substantially circular planar shape, this diaphragm may alternatively be of a rectangular shape as shown in FIGS. 6 and 7. In a piezoelectric diaphragm 13 of FIG. 6, a substantially square metal plate 14 is used therefor with a plurality of equal-sized projections 14*a* being provided at the periphery of the metal plate 14 for defining the stress transmission suppression device. Alternatively, with the piezoelectric diaphragm of FIG. 7, a substantially square-shaped metal plate 15 is used with multiple projections 15*a*, 15*b* of different sizes provided at the periphery thereof.

In these metal plates 14, 15 also, slits or windows may be formed to constitute the stress transmission suppression device instead of the plural projections.

Further, the planar shape of such piezoelectric diaphragms may be substantially rectangular or hexagonal as opposed to the substantially circular or square shapes.

Similarly, with regard to the first and second cylindrical casing members for support of an associated piezoelectric diaphragm, these members may be modified in arrangement so as to have any adequate shape in conformity with the shape of a piezoelectric diaphragm as employed. For example, in the case of supporting the piezoelectric diaphragm 13 of FIG. 6, substantially rectangular casing members with substantially rectangular closed-loop shaped support planes may be employed instead of the ring-like support planes 2*c*, 3*c* (see FIG. 1).

Figure 11:
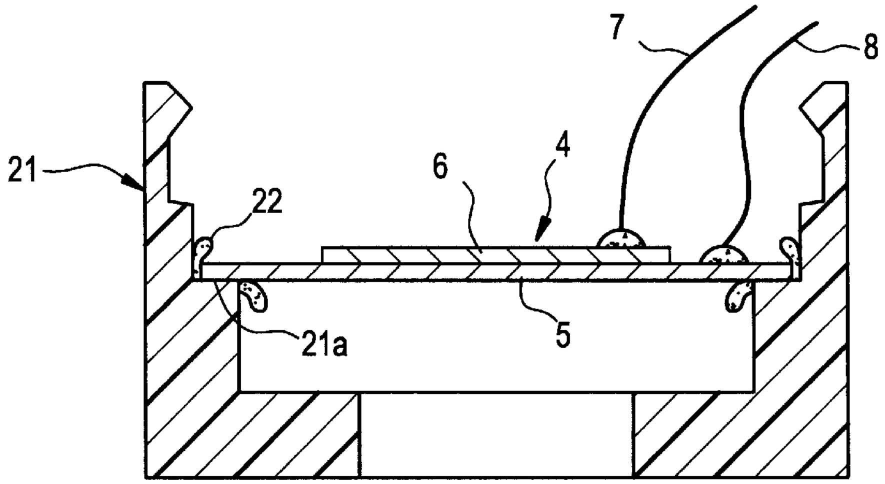
FIG. 11 is a diagrammatic representation of a cross-section of a piezoelectric electro-acoustic transducer in accordance with another preferred embodiment of the invention having a piezoelectric diaphragm supported by adhesive.

Still further, in the piezoelectric electro-acoustic transducer of FIG. 1, the piezoelectric diaphragm 4 is supported such that it is sandwiched between the cylindrical casings 2, 3 as the first and second casing members at the periphery of diaphragm 4; however, other appropriate support structures may alternatively be used therefor in the structure for rigid support of the piezoelectric diaphragm at the periphery thereof. One exemplary configuration is shown in FIG. 11, wherein a cylindrical casing 21 has a step-like portion at its intermediate height position for defining a closed loop-shaped support plane 21*a*, causing the piezoelectric diaphragm 4 to be rigidly attached using adhesive 22 onto the closed loop-shaped support plane 21*a*. In this case also, the piezoelectric diaphragm 4 is adhered by adhesive 22 and fixed only at selected portions that correspond to the aforementioned plural projections 5*a*. Accordingly, the resonance frequency can be lowered in a manner similar to that in the case of the piezoelectric electro-acoustic transducer 1 shown in FIG. 1.

It should be further noted that in the preferred embodiment shown in FIG. 1, while the lead wires 7, 8 constitute the electrode potential coupler device, this may be modified in such a manner that as shown in FIG. 12, spring-like elastic lead wires 23, 24 may be used and arranged to be electrically coupled to selected portions of the metal plate 5 and the piezoelectric ceramic disc 6, respectively, for achievement of electrical interconnection with corresponding electrode pads or terminals thereof.

It has been described that the piezoelectric electro-acoustic transducers according to preferred embodiments of the present invention successfully suppress or eliminate circumferential transmission of any stress possibly occurring at the periphery thereof during electrical drive operations because of the fact that it is arranged to employ a specific stress transmission suppression device for the piezoelectric diaphragm in addition to the circumferential support structure for the piezoelectric diaphragm at its outer periphery. A combination of the partial support of piezoelectric diaphragm at its periphery and the function of the stress transmission suppression device advantageously allows the resonance frequency to shift or offset toward much lower frequencies in comparison with prior art piezoelectric electro-acoustic transducers. Moreover, since the above desired result is attainable by adding the stress transmission suppression device to the piezoelectric diaphragm, it is unnecessary to provide any additional parts or components for support of the piezoelectric diaphragm on the side of such support structure, including a special structure for the casing members or the like. This enables the provision of a piezoelectric electro-acoustic transducer of extra-low resonance frequency while permitting use of conventional casing members without having to increase the manufacturing costs of piezoelectric electro-acoustic transducers.

Another significant advantage of the preferred embodiments of the present invention is that where the stress transmission suppression device is constituted by providing a plurality of projections, any intended piezoelectric diaphragm having the stress transmission suppression device can be easily arranged with a mere modification or alteration of the existing metal mold or cutting blades for use in press-forming metal plates for piezoelectric diaphragms of a desired planar shape or pattern.

Similarly, even where the stress transmission suppression device is to be constituted by use of slits, formation of such slits can be easily attained by forming slits using cutter blades in conventionally prepared metal plates each for use as the piezoelectric diaphragm.

Furthermore, in a case where the stress transmission suppression device is constituted by use of the windows also, the required fabrication steps will no longer be increased due to the possibility of press-forming a metal plate for the piezoelectric diaphragm and the windows therein at a time.

While the invention has been described in conjunction with specific preferred embodiments thereof, it is evident that many alterations, modifications and variations will be apparent to those skilled in the art in the light of the foregoing description. Accordingly, it is intended to embrace all such alterations, modifications and variations in the appended claims.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A piezoelectric electro-acoustic transducer comprising:

a planar piezoelectric diaphragm;

a piezoelectric ceramic disk disposed on the planar piezoelectric diaphragm and being supported on said planar piezoelectric diaphragm; and a stress transmission suppression device including a plurality of slits provided at the periphery of said planar piezoelectric diaphragm for suppressing transmission of a stress at the periphery of said planar piezoelectric diaphragm during energization, each of the plurality of slits including a first slit portion extending in a direction that is substantially perpendicular to the periphery of said planar piezoelectric diaphragm and a second slit portion extending in a direction that is substantially parallel to the periphery of said planar piezoelectric diaphragm and such that the periphery of said planar piezoelectric diaphragm maintains a continuous substantially circular shape despite the presence of the slits.

2. The piezoelectric electro-acoustic transducer according to claim 1, further comprising:

first and second casing members each having a closed-loop support plane; and said piezoelectric diaphragm being located between the closed-loop support planes of said first and second casing members such that the periphery of said piezoelectric diaphragm is partially supported by provision of said stress transmission suppression device.

3. The piezoelectric electro-acoustic transducer according to claim 2, wherein said first casing member is a first case having a step section disposed on an inner circumferential surface thereof for providing the closed-loop support plane and said second casing member is a second case inserted into said first casing member and having one end surface constituting the closed-loop support plane.

4. A piezoelectric electro-acoustic transducer comprising:

a piezoelectric diaphragm defined by only a flat metal plate which has a substantially square shape;

a piezoelectric ceramic disk disposed on the piezoelectric diaphragm and being supported on said piezoelectric diaphragm; and a stress transmission suppression device provided at a periphery of said piezoelectric diaphragm for suppressing transmission of a stress at the periphery of said piezoelectric diaphragm during energization, the stress transmission suppression device including a plurality of projections extending from the substantially square shape flat metal plate.

5. The piezoelectric electro-acoustic transducer according to claim 4, wherein said stress transmission suppression device includes an unsupported portion of said piezoelectric diaphragm located at the periphery thereof.

6. The piezoelectric electro-acoustic transducer according to claim 4, wherein said projections are disposed at the periphery of said piezoelectric diaphragm such that a space is defined between adjacent ones of said plurality of projected portions.

7. The piezoelectric electro-acoustic transducer according to claim 4, wherein said projections are different sizes.

8. The piezoelectric electro-acoustic transducer according to claim 4, wherein said projections are the same size.

9. The piezoelectric electro-acoustic transducer according to claim 4, further comprising:

first and second casing members each having a closed-loop support plane; and said piezoelectric diaphragm being located between the closed-loop support planes of said first and second casing members such that the periphery of said piezoelectric diaphragm is partially supported by provision of said stress transmission suppression device.

10. The piezoelectric electro-acoustic transducer according to claim 9, wherein said first casing member is a first case having a step section disposed on an inner circumferential surface thereof for providing the closed-loop support plane and said second casing member is a second case inserted into said first casing member and having one end surface constituting the closed-loop support plane.

* * * * *